(12) United States Patent
Lingier et al.

(10) Patent No.: US 8,455,177 B2
(45) Date of Patent: Jun. 4, 2013

(54) METHOD FOR MAKING A LITHOGRAPHIC PRINTING PLATE

(75) Inventors: Stefaan Lingier, Wondelgem (BE); Karen Demmers, Antwerp (BE)

(73) Assignee: Agfa Graphics NV, Mortsel (BE)

( * ) Notice: Subject to any disclaimer, the term of this patent is extended or adjusted under 35 U.S.C. 154(b) by 298 days.

(21) Appl. No.: 12/742,466

(22) PCT Filed: Nov. 4, 2008

(86) PCT No.: PCT/EP2008/064898
§ 371 (c)(1),
(2), (4) Date: May 12, 2010

(87) PCT Pub. No.: WO2009/062857
PCT Pub. Date: May 22, 2009

(65) Prior Publication Data
US 2011/0111347 A1 May 12, 2011

Related U.S. Application Data

(60) Provisional application No. 60/987,795, filed on Nov. 14, 2007.

(30) Foreign Application Priority Data

Nov. 13, 2007 (EP) .................................... 07120542

(51) Int. Cl.
*G03F 7/26* (2006.01)
*B41N 1/08* (2006.01)

(52) U.S. Cl.
USPC ......... 430/302; 430/300; 101/453; 101/463.1

(58) Field of Classification Search
USPC .................. 430/300, 302; 101/453, 463.1
See application file for complete search history.

(56) References Cited

U.S. PATENT DOCUMENTS

| 5,275,907 A | 1/1994 | Walls |
| 2006/0216638 A1 | 9/2006 | Watanabe |

FOREIGN PATENT DOCUMENTS

| EP | 0 625 728 A2 | 11/1994 |
| EP | 0 770 494 A2 | 5/1997 |
| EP | 0 770 495 A1 | 5/1997 |
| EP | 0 770 496 A1 | 5/1997 |
| EP | 0 770 497 A1 | 5/1997 |
| EP | 0 823 327 A2 | 2/1998 |
| EP | 0 864 420 A1 | 9/1998 |
| EP | 0 894 622 A2 | 2/1999 |
| EP | 0 901 902 A2 | 3/1999 |
| EP | 0 825 927 B1 | 8/1999 |
| EP | 1 338 415 A2 | 8/2003 |
| EP | 1 346 843 A1 | 9/2003 |
| EP | 1 398 151 A2 | 3/2004 |
| EP | 1 439 058 A2 | 7/2004 |
| WO | 2009021969 A1 | 2/2009 |

OTHER PUBLICATIONS

Official Communication issued in International Patent Application No. PCT/EP2008/064898, mailed on Dec. 23, 2008.
Loccufier et al., "Method of Making a Lithographic Printing Plate," U.S. Appl. No. 12/670,836, filed Jan. 26, 2010.
Loccufier et al, "Method for Making a Lithographic Printing Plate," U.S. Appl. No. 12/280,809, filed Aug. 27, 2008.
Loccufier et al., "Method for Making a Lithographic Printing Plate," U.S. Appl. No. 12/293,098, filed Sep. 16, 2008.
Lingier, "Method for Making a Lithographic Printing Plate," U.S. Appl. No. 12/297,268, filed Oct. 15, 2008.

*Primary Examiner* — Anca Eoff
(74) *Attorney, Agent, or Firm* — Keating & Bennett, LLP

(57) ABSTRACT

A method for making a positive-working lithographic printing plate includes the steps of: (1) providing a heat-sensitive printing plate precursor including on a support, having a hydrophilic surface or which is provided with a hydrophilic layer, a heat-sensitive coating; (2) image-wise exposing the precursor with heat and/or light; and (3) developing the exposed precursor with an aqueous alkaline developing solution including lithium ions at a concentration of at least 0.05% wt and a salt of an aliphatic carboxylic acid; wherein the molar ratio of the aliphatic carboxylic acid to the lithium ions is $\geq 1$.

19 Claims, No Drawings

METHOD FOR MAKING A LITHOGRAPHIC PRINTING PLATE

CROSS-REFERENCE TO RELATED APPLICATIONS

This application is a 371 National Stage Application of PCT/EP2008/064898, filed Nov. 4, 2008. This application claims the benefit of U.S. Provisional Application No. 60/987,795, filed Nov. 14, 2007, which is incorporated by reference herein in its entirety. In addition, this application claims the benefit of European Application No. 07120542.1, filed Nov. 13, 2007, which is also incorporated by reference herein in its entirety.

BACKGROUND OF THE INVENTION

1. Field of the Invention

The present invention relates to a method for making a lithographic printing plate.

2. Description of the Related Art

Lithographic printing presses use a so-called printing master such as a printing plate which is mounted on a cylinder of the printing press. The master carries a lithographic image on its surface and a print is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by crosslinking of a polymer, heat-induced solubilization or particle coagulation of a thermoplastic polymer latex.

The most popular thermal plates form an image by a heat-induced solubility difference in an alkaline developer between exposed and non-exposed areas of the coating. The coating typically includes an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working preferred embodiments of such thermal materials often require a pre-heat step between exposure and development as described in e.g. EP-625,728.

Negative working plate precursors which do not require a pre-heat step may contain an image-recording layer that works by heat-induced particle coalescence of a thermoplastic polymer particle (latex), as described in e.g. EP-As 770 494, 770 495, 770 496 and 770 497. These patents disclose a method for making a lithographic printing plate including the steps of (1) image-wise exposing an imaging element including hydrophobic thermoplastic polymer particles dispersed in a hydrophilic binder and a compound capable of converting light into heat, (2) and developing the image-wise exposed element by applying fountain and/or ink.

Some of these thermal processes enable platemaking without wet processing and are for example based on ablation of one or more layers of the coating. At the exposed areas the surface of an underlying layer is revealed which has a different affinity towards ink or fountain than the surface of the unexposed coating.

Other thermal processes which enable platemaking without wet processing are for example processes based on a heat-induced hydrophilic/oleophilic conversion of one or more layers of the coating so that at exposed areas a different affinity towards ink or fountain is created than at the surface of the unexposed coating.

EP 1 439 058 discloses a developing solution for developing a positive-working printing plate precursor including a heat-sensitive coating, the developing solution including an organic aliphatic carboxylic acid.

A major problem associated with positive-working printing plate precursors based on a solubility difference is the low differentiation between the development kinetics of exposed and non-exposed areas—i.e. the dissolution of the exposed areas in the developer is not completely finished before the unexposed areas also start dissolving in the developer. This often results in insufficient clean-out which may become apparent as a reduction of the sensitivity of the plate. Reduced clean-out usually results in toning (ink-acceptance in the non-image areas) of the printing plate and/or in ink build-up on the blanket. The low differentiation between the development kinetics of exposed and non-exposed areas may further lead to a loss of coating in the image areas, especially a loss of small image details or so-called high lights; a reduced press life and/or a reduced chemical resistance. Basically, a too small difference in dissolving rate in the developer between the exposed and the unexposed areas results in virtually no processing latitude. In order to increase this difference in dissolving rate, a so-called image dissolution inhibiting agent, which is capable of preventing etching of the image-areas during developing, is often added to the developer solution. However, such compounds may—possibly together with other components of the developer and/or non-image areas which are dissolved into the developer during processing—not only precipitate or salt-out (i.e. organic sludge) in the processing bath making the maintenance of the processing bath more burdensome, but may also deposit on the exit rollers of the developer section and/or build-up on the heater elements in the developer section. Moreover, eventually these deposit and/or precipitate (or salted-out) materials may adhere on the printing plate which impairs the images formed thereon; e.g. accept ink in the non-image areas. Besides the tendency of several components present in the developer to form precipitate and/or deposit materials, also inorganic sludge—caused by for example interaction of developer components with aluminum ions—is often formed during the processing step. It is known in the art that the addition of lithium salts to a developer solution may reduce the occurrence of inorganic sluge. However, although lithium salts reduce the level of inorganic sludge, they at the same time significantly increase the tendency to form precipitate and/or deposit materials in the developer, especially during the processing step. In view of the above described many major issues encountered during development of printing plates, there is a great need for further improving the quality of developers for positive-working printing plates; especially for developers based on metasilicate salts.

SUMMARY OF THE INVENTION

Preferred embodiments of the present invention provide a method for making a heat-sensitive lithographic printing plate whereby excellent printing properties are obtained and whereby during the processing step the formation of inorganic sludge and precipitate and/or deposit materials in the developer solution is minimised or even avoided.

A preferred embodiment is a method for making a lithographic printing plate which includes the steps of:

(1) providing a heat-sensitive printing plate precursor including on a support having a hydrophilic surface or which is provided with a hydrophilic layer, a heat-sensitive coating;

(2) image-wise exposing the precursor with heat and/or light;

(3) developing the exposed precursor with an aqueous alkaline developing solution including lithium ions at a concentration of at least 0.05% wt and a salt of an aliphatic carboxylic acid;

characterized in that the molar ratio of the aliphatic carboxylic acid to the lithium ions is $\geq 1$.

It was surprisingly found that the solubility of the components present in a developer solution and/or the stability of a developer solution including at least 0.05% wt lithium ions in combination with a salt of an aliphatic carboxylic acid—provided that the molar ratio of the aliphatic carboxylic acid to the lithium ions is $\geq 1$—is significantly improved. With an improved solubility of the components present in a developer solution and/or stability of a developer solution is meant that the tendency of the developer to form precipitate (i.e. organic sludge) and/or deposit materials is reduced. With precipitate and/or deposit materials is meant any insoluble material that either can be removed by filtration or which can not be filtered off.

Other features, elements, steps, characteristics and advantages of the present invention will become more apparent from the following detailed description of preferred embodiments of the present invention.

DETAILED DESCRIPTION OF THE PREFERRED EMBODIMENT

The aqueous alkaline developing solution used in a preferred embodiment of the method of the present invention, which will simply be referred to hereinafter as the developing solution, includes a salt of an aliphatic carboxylic acid. Preferably an alkali metal or ammonium salt is used. The salt of the aliphatic carboxylic acid may have 4 to 26 carbon atoms, more preferably 6 to 16 carbon atoms, and most preferably 8 to 12 carbon atoms. The aliphatic part of the carboxylic acid may either be straight or branched, and may be saturated or unsaturated having a double bond. Specific examples include salts of butyric acid, caproic acid, enanthylic acid, caprylic acid, capric acid, lauric acid, myristic acid, palmitic acid, stearic acid, arachidic acid, behenic acid and the like. The developing solution may include one of the above described salts of aliphatic carboxylic acids or a mixture thereof. Most preferrably caprylic acid, capric acid or lauric acid is used.

The developing solution further includes lithium ions at a concentration of at least 0.05% wt. Preferably, the concentration of lithium is at least 0.1% wt, more preferably at least 0.2% wt, even more preferably at least 0.3% wt and most preferably at least 0.4% wt. In any case, the molar ratio of the aliphatic carboxylic acid to the lithium ions is $\geq 1$, more preferably the molar ratio is >1. Alternatively, the molar ratio of the aliphatic carboxylic acid to the lithium ions is preferably $\leq 3$, more preferably $\leq 2$.

The lithium ions may be added in the form of organic salts like for example lithium benzoate, lithium citrate or lithium acetate, or inorganic salts. Inorganic salts are preferred. Suitable inorganic lithium salts include lithium chloride, lithium perchlorate, lithium bromide, lithium tetraborate, lithium phosphate, lithium silicates, lithium nitrate, lithium hydroxide, lithium carbonate and lithium sulfate. The developing solution may include one of the lithium salts or a mixture thereof. Lithium nitrate is preferred.

The developing solution used in a preferred embodiment of the present invention preferably contains a buffer such as for example a silicate-based buffer or a phosphate buffer. The concentration of the buffer in the developer preferably ranges bewteen 1 to 30% wt, more preferably between 3 and 20% wt and most preferably between 5 and 15% wt. Most preferably, the developer solution is a silicate-based developer. Silicate-based developers preferably have a molar ratio of silicon dioxide ($SiO_2$) to alkali metal oxide ($M_2O$, wherein M represents an alkali metal or an ammonium group) ranging between 0.5 to 3.0, and more preferably ranging between from 1.0 to 2.0. When the molar ratio $SiO_2/M_2O$ is less than 0.5, the alkalinity of the solution becomes too high and may cause a harmful effect such as etching of an aluminum plate which is generally used as a substrate in a lithographic printing plate precursor. When the molar ratio $SiO_2/M_2O$ is more than 3.0, the development performance of the solution may be decreased. Silicate-based developer which have a molar ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution including sodium or potassium metasilicate, i.e. a silicate where the ratio of silicon dioxide to alkali metal oxide is 1.

The developing solution preferably has a pH of at least 10, more preferably at least 11 and most preferably at least 12.

The developing solution preferably contains an image dissolution inhibiting agent. Image dissolution inhibiting agents are typically non-ionic, cationic or amphoteric compounds. Suitable examples of image dissolution inhibiting agents include:

(1) Polyglycols having the following structure:

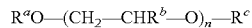

wherein $R^a$ represents hydrogen, an optionally substituted alkyl group having 1 to 30 carbon atoms, or more preferably 2 to 20 carbon atoms, —$COR^r$, an optionally substituted aryl group or an optionally substituted aralkyl group;

$R^b$ represents hydrogen, methyl, ethyl and/or mixtures thereof;

$R^d$ represents hydrogen, an alkyl group, —$COR^d$, —$NR^dR^e$, —$CH_2COOH$ or —$CH_2COO^-M^+$;

and wherein $M^+$ represents $NH_4^+$, $Na^+$ or $K^+$ and $R^r$, $R^d$ and $R^e$ independently represent hydrogen, an optionally substituted alkyl group having 1 to 30 carbon atoms, or more preferably 2 to 20 carbon atoms, an optionally substituted alkenyl group, an optionally substituted aryl group or an optionally substituted aralkyl group.

The optional substituents on the alkyl, aryl or aralkyl group may be selected from an alkyl group having upto 30 carbon atoms, or more preferably 2 to 20 carbon atoms, a hydroxide group or a halogen such as Cl or Br.

Block copolymers including blocks including polyglycols with different chemical structures (as discussed above) are image dissolution inhibiting agents of special interest. Such blockcopolymers can for example be obtained via ringopening polymerisation—e.g. ethoxylation—of carboxy-, amino-, or hydroxy-terminated polymers; by coupling of polyalkylene oxides having a functional endgroup (such as —OH or —NH$_2$) with other polymers having a functional endgroup (such as-COOH) or for example with maleic acid anhydride polymer; or reaction of monomers with polyalkylene oxides with specific endgroups (i.e. polyalkylene oxide macroinitiator, polyalkylene oxide macromonomer or polyalkylene oxide macro-transfer agent). Suitable examples include poly(ethylene oxide)-block-poly(propylene oxide)-block-poly(polyethylene oxide) e.g. Pluronic PE grades commercially available from BASF; poly(propylene oxide)-block-polyethylene oxide-block-polypropylene oxide e.g. Pluronic RPE grades commercially available from BASF; poly(caprolactone)-block-poly(ethylene oxide); poly(methyl methacrylate-block-poly(ethylene oxide); poly(hydroxystearic acid)-block-poly(ethylene oxide)-block-poly(hydroxy stearic acid) e.g. Dehymuls LE commercially available from Cognis; graft copolymers based on methacrylate or acrylate terminated polyethylene oxide or graft copolymers prepared by reaction of amine terminated poly(alkylene oxides) (e.g. Jeffamines commercially available form Huntsman) with maleic anhydride copolymers.

Also suitable image dissolution inhibiting agents are alkoxylates of multifunctional alcohols such as butane diol and trimethylol propane, and alkyl esters of alkoxylated saccharides or polysaccharides such as polyoxyethylene sorbitan monolaurate and polyoxyethylene sorbitan monostearate.

(2) Polycondensation products of one or more alkylene group and/or one or more polyoxyalkylene group with an alkylene diamine, an alkylene triamine, an alkylene polyamine or an alkylene imine group. Preferred alkylenes are $C_2$-$C_4$ alkylenes, preferred polyoxyalkylenes include polyoxyethylene or polyoxypropylene, preferred alkylene diamines are ethylene diamine and propylene diamine, and a preferred alkylene triamine is diethylene triamine. Also of interest are polyethoxylated diamines, such as ETHODUOMEEN T/13, ETHODUOMEEN T/25 (tradenames of Lion Corporation).

(3) Cationic surfactants including primary, secundary, tertiary or quaternary ammonium salts, phosphonium salts or sulfonium salts. Examples of the quaternary ammonium salts include tetra-alkyl quaternary ammonium salts, modified trialkyl quaternary ammonium salts, trialkyl benzyl quaternary ammonium salts, modified trialkyl benzyl quaternary ammonium salts, alkyl pyridinium salts, modified alkyl pyridinium salts, alkyl quinolinium salts, imidazolinium salts and benzimidazolinium salts. Counter anions suitable for the above cationic compounds are for example chloride, bromide, iodide, a sulphonate, sulphate, carboxylate, phosphate or phosphonate anion. Suitable specific examples include triethyl benzyl ammonium chloride, tetramethyl ammonium chloride, triethyl benzyl ammonium bromide, trioctyl methyl ammonium chloride, tributyl benzyl ammonium chloride, trimethyl benzyl ammonium chloride, N-lauryl pyridinium chloride, tetra-n-butyl ammonium hydroxide, trimethyl benzyl ammonium hydroxide, tetramethyl ammonium bromide, tetraethyl ammonium bromide, tetra-n-butyl ammonium bromide. The surfactants disclosed in EP 1 182 512 in [0031] to [0043], are also suitable examples of cationic image dissolution inhibiting agents and are incorporated herein by reference.

(4) Polyamines represented by the following structure:

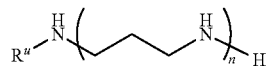

wherein
n represents an integer equal to 2, 3 or 4;
and $R^u$ represents an optionally substituted alkyl group having upto 30 carbon atoms, or more preferably 2 to 25 carbon atoms.

Suitable examples thereof include dodecyldipropylenetriamine, cocodipropylenetriamine and tallowdipropylenetriamine.

(5) Ethoxylated amines and/or ethoxylated ammonium salts such as:

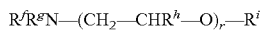

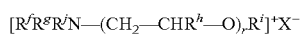

wherein $R^f$, $R^g$ and $R^j$ independently represent hydrogen, an alkyl group having up to 30 carbon atoms, or more preferably 2 to 20 carbon atoms, —$COR^s$, an optionally substituted aryl or aralkyl group;
$R^h$ represents hydrogen, methyl or ethyl and/or mixtures thereof;
$R^i$ represents hydrogen, an optionally substituted alkyl group having 1 to 30 C atoms, or more preferably 2 to 20 carbon atoms, —$COR^k$, —$CH_2COOH$ or —$CH_2COO^-M^+$ with $M^+$=optionally substituted ammonium ion, $Na^+$ or $K^+$;
and wherein $R^k$ represents hydrogen, an optionally substituted alkyl group having 1 to 30 C atoms, or more preferably 2 to 20 carbon atoms, an optionally substituted aryl group or an optionally substituted aralkyl group;
$R^s$ represents an optionally substituted alkyl group having 1 to 30 C atoms, or more preferably 2 to 20 carbon atoms, an optionally substituted aryl group or an optionally substituted aralkyl group;
r represents an integer ranging between 2 to 30;
$X^-$ represents chloride, bromide, iodide, a sulphonate, sulphate, carboxylate, phosphate or phosphonate anion.

(6) Amphoteric surfactants represented by the following formula's:

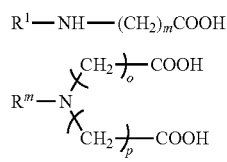

wherein:
$R^l$ and $R^m$ independently represents an optionally substituted alkyl group having 2 to 30 carbon atoms, or more preferably 4 to 20 carbon atoms;
m, o and p independently represent an integer ranging between 1 to 20.

Suitable examples thereof include betaine dervatives such as lauryl betaine, and glycine derivatives such as N-alkyl glycinate.

(7) Castor oil ethoxylates represented by the following structure:

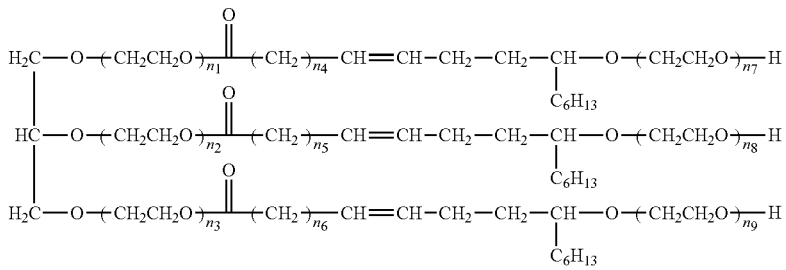

wherein $n_1$ to $n_3$ independently represents an integer ranging from 0 to 40 and $n_4$ to $n_9$ independently represents an integer ranging from 2 to 40.

(8) Surfactants including polymers including siloxane unit—e.g. a —Si(R,R')—O— group wherein R and R' are optionally substituted alkyl or aryl groups—and/or perfluoroalkyl units—e.g. a —(CF$_2$)— unit; or block- or graft-copolymers including a polyalkylene oxide block—e.g. —C$_n$H$_{2n}$—O— wherein n is preferably an integer in the range 2 to 5—and a block of polysiloxane and/or perfluoroalkyl units.

Specific examples of suitable image dissolution inhibiting agents include:

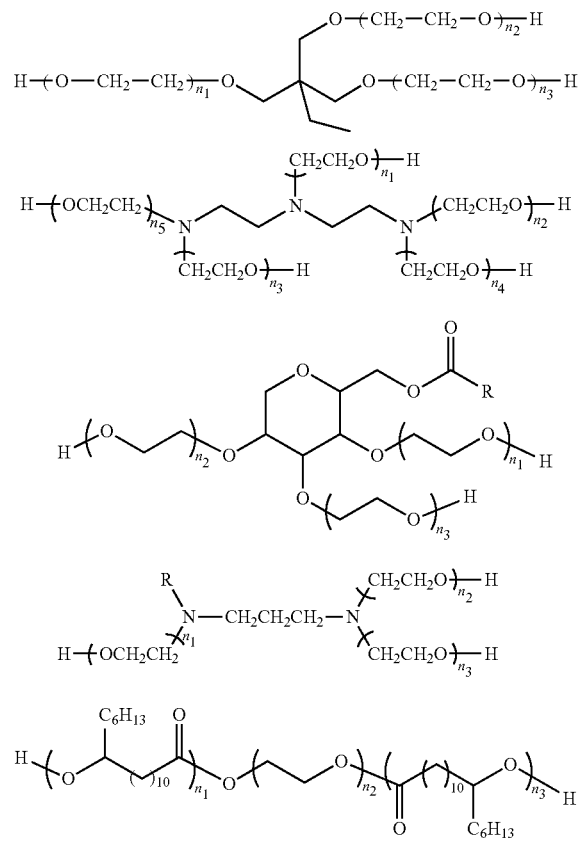

-continued

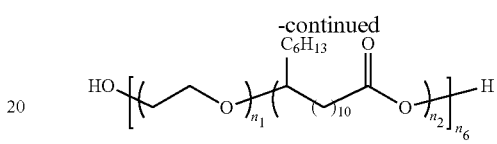

wherein independently in each of the structures above $n_1$ to $n_5$ independely represent an integer ranging between 2 and 40 and $n_6$ independely represents an integer ranging from 1 to 40.

In a preferred embodiment, the developing solution contains an image dissolution inhibiting agent selected from polycondensation products of one or more alkylene group and/or one or more polyoxyalkylene group with an alkylene diamine, an alkylene triamine, an alkylene polyamine or an alkylene imine group.

The developer solution may contain other surfactants for improving its developing properties. Examples of suitable anionic surfactants include salts of higher alcohol (C8~C22) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and sodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate, sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

The developing solution may optionally contain further components as known in the art: other buffer substances such as carbonate based buffers; chelating agents such as EDTA or NTA as disclosed in U.S. Pat. No. 4,469,776; complexes such as [Co(NH$_3$)$_6$]Cl$_3$ as disclosed in U.S. Pat. No. 4,606,995; inorganic salts such as sodium or kalium chloride or kalium bromide; inorganic alkaline agents such as sodium or lithium hydroxides, secundary or tertiairy phosphates, sodium, potassium or ammonium carbonates, sodium or potassium bicarbonates, sodium, potassium or ammonium borates or citrates; organic alkaline agents such as alkyl amines, dialkyl amines or trialkyl amines, ethanolamines, ethylenediamine or pyridines; antifoaming agents; organic solvents—such as carboxylic acid esters i.e. alkyl acetates, alkyl ketones, ethylene glycol alkyl ethers, ethylene glycol aryl ethers, benzyl alcohol, xylene or methylene chloride—in small amounts i.e. preferably less than 10% wt and more preferably less than 5% wt; nonreducing sugars such as trehalose-type oligosaccharides i.e. sucrose or trehalose, glycosides i.e. alkyl glucosides or phenol glucosides, sugar alcohols i.e. D,L-sorbitol or xylitol or sugar compounds having a carboxylic acid group i.e. gluconic acid, D-glucaric acid or pentaric acid; corrosion inhibitors; dyes and/or hydrotropic agents. All these components may be used alone or in combination.

During the development step the heat-sensitive lithographic printing plate precursor is immersed in the developing solution described above, optionally in combination with mechanical rubbing, e.g. by a rotating brush. Thereby non-image areas of the coating and preferably any water-soluble layer, if present, are removed with the developing solution. The development step is preferably carried out at temperatures ranging between 20 and 40° C. in automated processing units as customary in the art.

To ensure, a stable processing with the developer solution for a prolonged time, it is particularly important to control the concentration of the ingredients in the developer. Therefore a replenishing solution, hereinafter also referred to as replenisher, is often added to the developing solution. More than one replenishing solution containing different ingredients and/or different amounts of the ingredients may be added to the developing solution. Alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. It is advantageous that the salt of the aliphatic carboxylic acid and/or lithium ions are present in the replenisher(s); preferably at concentrations which provide a molar ratio of the salt of the aliphatic carboxylic acid to the lithium ions in the developing solution of 1 or greater than 1.

The replenishing solution has preferably a pH value of at least 10, more preferably of at least 11, most preferably of at least 12.

The replenishing solution may be added continuously or in small amounts to the developing solution in order to regulate the concentration of the active ingredients in the developing solution at a constant level and/or at a level sufficiently high to ensure a stable development. The required amounts of regenerated material must be tailored to the developing apparatus used, the daily plate throughput, the composition of the image areas, etc. and are in general from 1 to 150 ml per square meter of plate precursor. The addition of replenisher can be regulated, for example, by measuring the conductivity of the developer as described in EP 556 690. Other means of supplementing a replenisher to the developer may be employed. Examples thereof include a method for intermittently or continuously supplementing a replenisher as a function of time and amount of plates processed as disclosed in GB 2 046 931; a method including disposing a sensor for detecting the degree of light-sensitive layer dissolved out in the middle portion of a developing zone and supplementing the replenisher in proportion to the detected degree of the light-sensitive layer dissolved out as disclosed in U.S. Pat. No. 4,537,496; a method including determining the impedance value of a developer and processing the detected impedance value by a computer to perform supplementation of a replenisher as disclosed in GB 2 208 249.

The lithographic printing plate precursor used in a preferred embodiment of the method of the present invention includes a heat and/or light sensitive coating on a support. The imaging mechanism of such printing plate precursors can be triggered by direct exposure to heat, e.g. by a thermal head, or by the light absorption of one or more compounds in the coating that are capable of converting light, more preferably infrared light, into heat.

The thermal printing plate precursor used in a preferred embodiment of the method of the present invention includes a heat and/or light sensitive coating and is positive working. The coating includes a water-insoluble and alkali soluble resin which exhibits an increased solubility upon exposure to heat and/or light (further also referred to as "the first layer"). The water-insoluble and alkali soluble resin is preferably an oleophilic resin. The oleophilic resin is preferably a polymer that is soluble in an aqueous developer, more preferably an aqueous alkaline developing solution with a pH between 7.5 and 14. Preferred polymers are phenolic resins e.g. novolac, resoles, polyvinyl phenols and carboxy substituted polymers. Typical examples of these polymers are described in DE 4007428, DE 4027301 and DE 4445820. The amount of phenolic resin present in the coating is preferably at least 50% by weight, preferably at least 80% by weight relative to the total weight of all the components present in the coating. The oleophilic resin is preferably a phenolic resin wherein the phenyl group or the hydroxy group is chemically modified with an organic substituent. The phenolic resins which are chemically modified with an organic substituent may exhibit an increased chemical resistance against printing chemicals such as fountain solutions or plate treating liquids such as plate cleaners. Examples of such chemically modified phenolic resins are described in EP 934 822; EP 1 072 432; U.S. Pat. No. 5,641,608; EP 982 123; WO 99/01795; EP 2 102 446, EP 2 102 444; EP 2 102 445; EP 2 102 443; EP 3 102 522; WO04/035310; WO04/035686; WO04/035645; WO04/035687 or EP 1 506 858. The modified resins described in EP 2 102 446, are preferred, especially those resins wherein the phenyl-group of the phenolic resin is substituted with a group having the structure —N=N-Q, wherein the —N=N— group is covalently bound to a carbon atom of the phenyl group and wherein Q is an aromatic group.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may also be a polymer of one or more hydroxy-phenyl containing monomers such as hydroxystyrenes or hydroxy-phenyl(meth)acrylates. Examples of such hydroxystyrenes are o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl(meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1,000 to 200,000 g/mol, more preferably from 1,500 to 50,000 g/mol.

Examples of phenolic resins are:
ALNOVOL™ SPN452, 40% wt of a novolac resin in DOWANOL™ PM, commercially available from CLARIANT GmbH.
ALNOVOL™ SPN400, 44% wt of a novolac resin in DOWANOL™ PM, commercially available from CLARIANT GmbH.
ALNOVOL™ HPN100, novolac resin commercially available from CLARIANT GmbH.
DURITE™ PD443, novolac resin commercially available from BORDEN CHEM. INC.
DURITE™ SD423A, novolac resin commercially available from BORDEN CHEM. INC.
DURITE™ SD126A, novolac resin commercially available from BORDEN CHEM. INC.
BAKELITE™ 6866LB02, novolac resin commercially available from BAKELITE AG.
BAKELITE™ 6866LB03, novolac resin commercially available from BAKELITE AG.
KR 400/8, novolac resin commercially available from KOYO CHEMICALS INC.
HRJ 1085, novolac resin commercially available from SCHNECTADY INTERNATIONAL INC.
HRJ 2606, phenol novolac resin commercially available from SCHNECTADY INTERNATIONAL INC.
LYNCUR™ CMM, copolymer of 4-hydroxy-styrene and methyl methacrylate commercially available from SIBER HEGNER.

The coating may include a second layer, which is located between the hydrophilic support and the first layer, including a water-insoluble and alkali soluble resin. The water-insoluble and alkali soluble resin is preferably a polymer or copolymer (i.e.(co)polymer) including at least one monomeric unit that includes at least one sulfonamide group. Hereinafter, "a (co)polymer including at least one monomeric unit that includes at least one sulfonamide group" is also referred to as "a sulphonamide (co)polymer" or "a sulphonamide binder". The sulphonamide group is preferably represented by —NR—SO$_2$—, —SO$_2$—NR— or —SO$_2$—NRR' wherein R and R' each independently represent hydrogen or an organic substituent.

Sulfonamide (co)polymers are preferably high molecular weight compounds prepared by homopolymerization of monomeric units containing at least one sulfonamide group or by copolymerization of such monomeric units and other polymerizable monomeric units.

Examples of monomeric units containing at least one sulfonamide group include monomeric units further containing at least one polymerizable unsaturated bond such as an acryloyl, allyl or vinyloxy group. Suitable examples are disclosed in U.S. Pat. No. 5,141,838, EP 1 545 878; EP 909,657, EP 0 894 622 and EP 1,120,246.

Examples of monomeric units copolymerized with the monomeric units containing at least one sulfonamide group include monomeric units as disclosed in EP 1,262,318, EP 1,275,498, EP 909,657, EP 1,120,246,EP 0 894 622 and EP 1,400,351.

Suitable examples of sulfonamide (co)polymers and/or their method of preparation are disclosed in EP-A 933 682, EP-A 982 123, EP-A 1 072 432, WO 99/63407 and EP 1,400, 351.

A highly preferred example of a sulfonamide (co)polymer is a homopolymer or copolymer including a structural unit represented by the following general formula (IV):

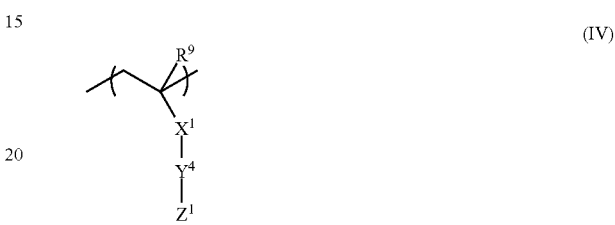

wherein:
$R^9$ represents hydrogen or a hydrocarbon group having up to 12 carbon atoms; preferably $R^9$ represents hydrogen or a methyl group;

$X^1$ represents a single bond or a divalent linking group. The divalent linking group may have up to 20 carbon atoms and may contain at least one atom selected from C, H, N, O and S. Preferred divalent linking groups are a linear alkylene group having 1 to 18 carbon atoms, a linear, branched, or cyclic group having 3 to 18 carbon atoms, an alkynylene group having 2 to 18 carbon atoms and an arylene group having 6 to 20 atoms, —O—, —S—, —CO—, —CO—O—, —O—CO—, —CS—, —NR″R°—, —CO—NR″—, —NR″—CO—, —NR″—CO—O—, —O—CO—NR″—, —NR″—CO—NR°—, —NR″—CS—NR°—, a phenylene group, a naphtalene group, an anthracene group, a heterocyclic group, or combinations thereof, wherein R″ and R° each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group. Preferably $X^1$ is a methylene group, an ethylene group, a propylene group, a butylene group, an isopropylene group, cyclohexylene group, a phenylene group, a tolylene group or a biphenylene group;

$Y^4$ is a bivalent sulphonamide group represented by —NR$^p$—SO$_2$— or —SO$_2$—NR$^9$— wherein R$^p$ and R$^q$ each independently represent hydrogen, an optionally substituted alkyl, alkanoyl, alkenyl, alkynyl, cycloalkyl, heterocyclic, aryl, heteroaryl, aralkyl or heteroaralkyl group or a group of the formula —C(=N)—NH—R$^{10}$, wherein R$^{10}$ represents hydrogen or an optionally substituted alkyl or aryl group;

$Z^1$ represents a terminal group preferably represented by hydrogen or an optionally substituted linear, branched, or cyclic alkylene or alkyl group having 1 to 18 carbon atoms such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, an optionally substituted arylene or aryl group having 6 to 20 carbon atoms; an optionally substituted hetero-arylene or heteroaryl group; a linear, branched, or cyclic alkenylene or alkenyl group having 2 to 18 carbon atoms, a linear, branched, or cyclic alkynylene or alkynyl group having 2 to 18 carbon atoms or an alkoxy group.

Examples of preferred substituents optionally present on the groups representing $Z^1$ are an alkyl group having up to 12 carbon atoms, an alkoxy group having up to 12 carbon atoms, a halogen atom or a hydroxyl group.

The structural unit represented by the general formula (IV) has preferably the following groups:

$X^1$ represents an alkylene, cyclohexylene, phenylene or tolylene group, —O—, —S—, —CO—, —CO—O—, —O—CO—, —CS—, —NR″R°—, —CO—NR″—, —NR″—CO—, —NRn-CO—O—, —O—CO—NR″—, —NR″—CO—NR°—, —NR″—CS—NR°—, or combinations thereof, and wherein R″ and R° each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group;

$Y^4$ is a bivalent sulphonamide group represented by —NR$^p$—SO$_2$—, —SO$_2$—NR$^q$— wherein R$^p$ and R$^q$ each independently represent hydrogen, an optionally substituted alkyl, alkanoyl, alkenyl, alkynyl, cycloalkyl, heterocyclic, aryl, heteroaryl, aralkyl or heteroaralkyl group;

$Z^1$ is a terminal group represented by hydrogen, an alkyl group such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group or an octyl group, a benzyl group, an optionally substituted aryl or heteroaryl group, a naphtyl group, an anthracenyl group, a pyridyl group, an allyl group or a vinyl group.

Specific preferred examples of sulphonamide (co)polymers are polymers including N-(p-aminosulfonylphenyl) (meth)acrylamide, N-(m-aminosulfonylphenyl)(meth)acrylamide and/or N-(o-aminosulfonylphenyl)(meth)acrylamide. A particularly preferred sulphonamide (co)polymer is a polymer including N-(p-aminosulphonylphenyl)methacrylamide wherein the sulphonamide group includes an optionally substituted straight, branched, cyclic or heterocyclic alkyl group, an optionally substituted. aryl group or an optionally substituted heteroaryl group.

The dissolution behavior of the coating can be fine-tuned by optional solubility regulating components. More particularly, development accelerators and development inhibitors can be used. In the preferred embodiment where the coating includes more than one layer, these ingredients can be added to the first layer, to the second layer and/or to an optional other layer of the coating.

Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulphonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulphonic acid, dodecylbenzenesulphonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins including at least 70 mol % meta-cresol as recurring monomeric units are also suitable development accelerators.

In a preferred embodiment, the coating also contains a developer resistance, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP-A 823 327 and WO97/39894 are believed to act as dissolution inhibitors due to interaction, e.g. by hydrogen bridge formation, with the alkali-soluble resin(s) in the coating. Inhibitors of this type typically include at least one hydrogen bridge forming group such as nitrogen atoms, onium groups, carbonyl (—CO—), sulfinyl (—SO—) or sulfonyl (—SO$_2$—) groups and a large hydrophobic moiety such as one or more aromatic rings. Some of the compounds mentioned below, e.g. infrared dyes such as cyanines and contrast dyes such as quaternized triarylmethane dyes can also act as a dissolution inhibitor.

Other suitable inhibitors improve the developer resistance because they delay the penetration of the aqueous alkaline developer into the coating. Such compounds can be present in the first layer and/or, if present, in the second layer as described in e.g. EP-A 950 518, and/or in a development barrier layer on top of the layer, as described in e.g. EP-A 864 420, EP-A 950 517, WO 99/21725 and WO 01/45958. In the latter preferred embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include the following:

A polymeric material which is insoluble in or impenetrable by the developer, e.g. a hydrophobic or water-repellent polymer or copolymer such as acrylic polymers, polystyrene, styrene-acrylic copolymers, polyesters, polyamides, polyureas, polyurethanes, nitrocellulosics and epoxy resins; or polymers including siloxane (silicones) and/or perfluoroalkyl units.

Bifunctional compounds such as surfactants including a polar group and a hydrophobic group such as a long chain hydrocarbon group, a poly- or oligosiloxane and/or a perfluorinated hydrocarbon group. A typical example is Megafac F-177, a perfluorinated surfactant available from Dainippon Ink & Chemicals, Inc. A suitable amount of such compounds is between 10 and 100 mg/m$^2$, more preferably between 50 and 90 mg/m$^2$.

Bifunctional block-copolymers including a polar block such as a poly- or oligo(alkylene oxide) and a hydrophobic block such as a long chain hydrocarbon group, a poly- or oligosiloxane and/or a perfluorinated hydrocarbon group. A suitable amount of such compounds is between 0.5 and 25 mg/m$^2$, preferably between 0.5 and 15 mg/m$^2$ and most preferably between 0.5 and 10 mg/m$^2$. A suitable copolymer includes about 15 to 25 siloxane units and 50 to 70 alkyleneoxide groups. Preferred examples include copolymers including phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. The poly- or oligosiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer or oligomer is at least 2, preferably at least 10, more preferably at least 20. It may be less than 100, preferably less than 60.

It is believed that during coating and drying, the above mentioned inhibitor of type (b) and (c) tends to position itself, due to its bifunctional structure, at the interface between the coating and air and thereby forms a separate top layer even when applied as an ingredient of the coating solution of the first and/or of the optional second layer. Simultaneously, the surfactants also act as a spreading agent which improves the coating quality. The separate top layer thus formed seems to be capable of acting as the above mentioned barrier layer which delays the penetration of the developer into the coating.

Alternatively, the inhibitor of type (a) to (c) can be applied in a separate solution, coated on top of the first, optional second and/or other layers of the coating. In that preferred embodiment, it may be advantageous to use a solvent in the separate solution that is not capable of dissolving the ingredients present in the other layers so that a highly concentrated water-repellent or hydrophobic phase is obtained at the top of the coating which is capable of acting as the above mentioned development barrier layer.

In addition, the first or optional second layer and/or other layer may include polymers that further improve the run length and/or the chemical resistance of the plate. Examples thereof are polymers including imido (—CO—NR—CO—) pendant groups, wherein R is hydrogen, optionally substituted alkyl or optionally substituted aryl, such as the polymers described in EP-A 894 622, EP-A 901 902, EP-A 933 682 and WO 99/63407.

The coating of the heat-sensitive printing plate precursor preferably also contains an infrared light absorbing dye or pigment which, in the preferred embodiment where the coating includes more than one layer, may be present in the first layer, and/or in the second layer, and/or in an optional other layer. Preferably, the infrared light absorbing compound is present in the first layer.

Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

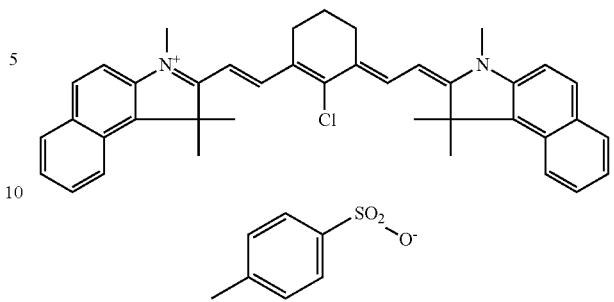

IR-1

The concentration of the IR-dye in the coating is preferably between 0.25 and 15.0% wt, more preferably between 0.5 and 10.0% wt, most preferably between 1.0 and 7.5% wt relative to the coating as a whole.

The coating may further include one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP 400 706 are suitable contrast dyes. Dyes which, combined with specific additives, only slightly color the coating but which become intensively colored after exposure, as described in for example WO2006/005688 may also be used as colorants.

To protect the surface of the coating of the heat and/or light-sensitive printing plate precursors, in particular from mechanical damage, a protective layer may also optionally be applied. The protective layer generally includes at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 µm, preferably from 0.1 to 3.0 µm, particularly preferably from 0.15 to 1.0 µm.

Optionally, the coating may further contain additional ingredients such as further surfactants, silicon or titanium dioxide particles or polymers particles such as matting agents and spacers.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The support of the lithographic printing plate precursor may be a sheet-like material such as a plate or it may be a cylindrical element such as a sleeve which can be slid around a print cylinder of a printing press. Preferably, the support is a metal support such as aluminum or stainless steel. The support can also be a laminate including an aluminum foil and a plastic layer, e.g. polyester film.

A particularly preferred lithographic support is an electrochemically grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminum is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 µm. The aluminum substrate of a preferred embodiment of the current invention has preferably an Ra value below 0.45 µm, more preferably below 0.40 µm and most preferably below 0.30 µm. The lower limit of the Ra value is preferably about 0.1 µm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight ($g/m^2$ $Al_2O_3$ formed on the aluminum surface) varies between 1 and 8 $g/m^2$. The anodic weight is preferably $\geq 3$ $g/m^2$, more preferably $\geq 3.5$ $g/m^2$ and most preferably $\geq 4.0$ $g/m^2$.

The grained and anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzene-sulphonic acid, sulphuric acid esters of polyvinyl alcohol, and acetals of polyvinyl alcohols formed by reaction with a sulphonated aliphatic aldehyde.

Another useful post-anodic treatment may be carried out with a solution of polyacrylic acid or a polymer including at least 30 mol % of acrylic acid monomeric units, e.g. GLASCOL E15, a polyacrylic acid, commercially available from Ciba Speciality Chemicals.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

The heat-sensitive plate precursor can be image-wise exposed directly with heat, e.g. by a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e. no substantial effect on the dissolution rate of the coating in the developer is induced by exposure to visible light. Most preferably, the coating is not sensitive to ambient daylight.

The printing plate precursor can be exposed to infrared light by e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 µm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. Nos. 5,174,205 and 5,163,368.

After exposure, the precursor is developed as described above.

The development step may be followed by a rinsing step, a gumming step, a drying step and/or a post-baking step. The plate precursor can, if required, be further post-treated with a suitable correcting agent or preservative as known in the art.

The gumming step involves post-treatment of the lithographic printing plate with a gum solution. A gum solution is typically an aqueous liquid which includes one or more surface protective compounds that are capable of protecting the lithographic image of a printing plate against contamination or damaging. Suitable examples of such compounds are film-forming hydrophilic polymers or surfactants.

To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The heat-sensitive printing plates can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink includes an ink phase, also called the hydrophobic or oleophilic phase, and a polyol phase as described in WO 00/32705.

The developing solution used in a preferred embodiment of the method of the present invention can also be used for treating thermo-resists, for example on a PCB (printed circuit board) application as described in US 2003/0003406 A1.

EXAMPLES

1. Preparation of the Lithographic Support.

A 0.30 mm thick aluminum foil was degreased by immersing the foil in an aqueous solution containing 34 g/l of sodium hydroxide at 70° C. for 6 seconds and rinsed with demineralized water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ at a temperature of 37° C. and a current density of 100 $A/dm^2$. The aluminum foil was then desmutted by etching with an aqueous solution containing 145 g/l of sulfuric acid at 80° C. for 5 seconds and rinsed with demineralized water for 4 seconds. The foil was subsequently subjected to anodic oxidation during 10 seconds in an aqueous solution containing 145 g/l of sulfuric acid at a temperature of 57° C. and a current density of 25 $A/dm^2$, then washed with demineralized water for 7 seconds and post-treated for 4 seconds with a solution containing 2.2 g/l of polyvinylphosphonic acid at 70° C., rinsed with demineralized water for 3.5 seconds and dried at 120° C. for 7 seconds.

The support thus obtained was characterized by a surface roughness Ra of 0.35-0.40 μm (measured with interferometer NT1100) and an anodic weight of 3.0 $g/m^2$.

2. Preparation of the Printing Plate Precursor PPP-01.
(1) First Layer.

The PPP-01 was produced by first applying a first coating layer defined in Table 1 onto the above described lithographic support at a wet coating thickness of 20 μm.

TABLE 1

| composition of the first coating solution | |
|---|---|
| Composition of the first coating solution | g |
| Dowanol PM (1) | 293.84 |
| THF | 590.24 |
| Binder-01 (25 wt %) (2) | 115.04 |
| Crystal Violet (3) | 0.44 |
| Tegoglide 410 (10 wt % solution) (4) | 0.45 |

(1) Propyleneglycol-monomethylether (1-methoxy-2-propanol) commercially available from Dow Chemical Company;
(2) Binder-01 preparation see (2);
(3) Crystal Violet is a quaternised triarylmethane dye commercially available from Ciba-Geigy GmbH.;
(4) 10 wt % solution of Tegoglide 410 in Dowanol PM; Tegoglide 410 is a copolymer of polysiloxane and poly(alkylene oxide), commercially available from Tego Chemie Service GmbH..

The total dry coating weight amounts to 0.671 $g/m^2$. The dry weight of the ingredients in the first coating is shown in Table 2.

TABLE 2

| Dry coating weight of first coating. | |
|---|---|
| Dry Weight of the first coating * | $mg/m^2$ |
| Binder-01 | 660.0 |
| Crystal Violet | 10.0 |
| Tegoglide 410 | 1.0 |

* ingredientsas defined in Table 1.

(2) Preparation of Binder-01.

In a 250 ml reactor, 162 mmol of Monomer-01, 21.3 g (132 mmol) benzyl acrylamide, 0.43 g (6 mmol) acrylic acid and 103 g gamma-butyrolactone were added and the mixture was heated to 140° C., while stirring at 200 rpm. A constant flow of nitrogen was put over the reactor. After dissolution of all the components, the reactor was cooled to 100° C. 0.35 ml Trigonox DC50, commercially available from AKZO NOBEL, was added followed by the addition of 1.39 ml Trigonox 141, commercially available from AKZO NOBEL, in 3.43 ml butyrolactone. The polymerization was started and the reactor was heated to 140° C. over 2 hours while dosing 1.75 ml Trigonox DC50. The mixture was stirred at 400 rpm and the polymerization was allowed to continue for 2 hours at 140° C. The reaction mixture was cooled to 120° C. and the stirrer speed was enhanced to 500 rpm. 85.7 ml 1-methoxy-2-propanol was added and the reaction mixture was allowed to cool down to room temperature.

Binder-01 was analyzed with $^1$H-NMR-spectroscopy and size exclusion chromatography, using dimethyl acetamide/0.21% LiCl as eluent on a 3× mixed-B column and relative to polystyrene standards.

| | $M_n$ | $M_w$ | PD |
|---|---|---|---|
| Binder-01 | 23500 | 67000 | 2.84 |

The reaction mixture was cooled to 40° C. and the resulting 25 weight % polymer solution was collected in a drum.

Monomer-01:

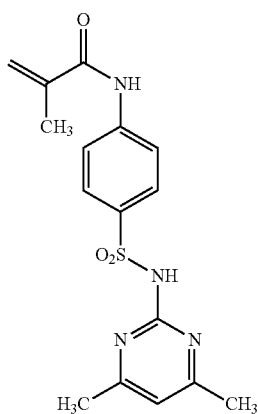 [SMILES: C=C(C)C(=O)Nc1ccc(S(=O)(=O)Nc2nc(C)cc(C)n2)cc1]

(3) Second Layer.

Above the first layer, a second coating solution with the composition as defined in Table 3 (coating solution 2) was coated on the previous layer at a wet coating thickness of 28 μm resulting in the printing plate precursor PPP-01.

TABLE 3 composition of the second coating solution 02.

| Composition coating solution_02 | g |
|---|---|
| Dowanol PM | 450.27 |
| MEK | 484.50 |
| Alnovol SPN402 (44.3%) (1) | 61.07 |
| TMCA (2) | 2.30 |
| Adagio (3) | 1.03 |
| Crystal Violet (4) | 0.41 |
| Tegoglide 410 (10 wt % solution) (5) | 0.42 |

(1) Alnovol SPN402 is a 44.0 wt. % solution in Dowanol PM of a m,p-cresol-cresol-xylenol formaldehyde novolac resin commercially available from Clariant GmbH;
(2) TMCA is 3,4,5-trimethoxy cinnamic acid:

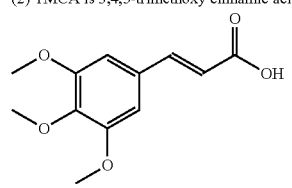

(3) Adagio is an IR absorbing cyanine dye, commercially available from FEW CHEMICALS; the chemical structure is given above IR-01;
(4) Crystal Violet is a quaternised triarylmethane dye from Ciba-Geigy:

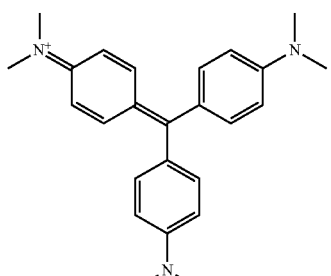

(5) 10 wt % solution of Tegoglide 410 in Dowanol PM. Tegoglide 410 is a polydimethylsiloxane/poly(alkylene oxide) surfactant, commercially available from TEGO CHEMIE SERVICE GmbH.

The total dry coating weight of the second coating amounts to 0.75 g/m$^2$ and the dry weight of the ingredients is given in Table 4.

TABLE 4 dry coating weight of the second coating.

| Dry Weight of second coating* | mg/m$^2$ |
|---|---|
| Alnovol SPN402 | 653.0 |
| TMCA | 56.0 |
| Adagio | 25.0 |
| Crystal Violet | 10.0 |
| Tegoglide 410 | 1.0 |

*ingredients as defined in Table 3.

3. Developers DEV-1 to DEV-21.

Several developer solutions are made of which the composition is given in table 5. The conductivity was adjusted using a 50% solution of sodium hydroxide to a value ranging between 75.8 to 76.2 mS/cm. There is a clear relation between conductivity and the pH value of these developers.

TABLE 5 composition of the developer solutions DEV-1 to DEV-21.

| Composition of the developer g/l | DEV-1 | DEV-2 | DEV-3 | DEV-4 | DEV-5 | DEV-6 | DEV-7 | DEV-8 | DEV-9 | DEV-10 | DEV-11 |
|---|---|---|---|---|---|---|---|---|---|---|---|
| Na-metasilicate (1) | 100 | = | = | = | = | = | = | = | = | = | = |
| Crafol AP261* (2) | 10.80 | = | = | = | = | = | = | = | = | = | = |
| Surfynol 104H (3) | 0.67 | = | = | = | = | = | = | = | = | = | = |
| Synperonic T304 (4) | 4.32 | = | = | = | = | = | = | = | = | = | = |
| Sodium Gluconate (5) | 20 | = | = | = | = | = | = | = | = | = | = |
| Caprylic Acid (6) | 4.3 | 13 | 15 | 20 | 25 | 30 | 15 | 20 | 25 | 30 | 15 |
| LiNO$_3$ (7) | 0 | 0 | 0 | 0 | 0 | 0 | 5 | 5 | 5 | 5 | 10 |

| Composition of the developer g/l | DEV-12 | DEV-13 | DEV-14 | DEV-15 | DEV-16 | DEV-17 | DEV-18 | DEV-19 | DEV-20 | DEV-21 |
|---|---|---|---|---|---|---|---|---|---|---|
| Na-metasilicate (1) | = | = | = | = | = | = | = | = | = | = |
| Crafol AP261* (2) | = | = | = | = | = | = | = | = | = | = |
| Surfynol 104H (3) | = | = | = | = | = | = | = | = | = | = |

TABLE 5-continued

| | | | | | | | | | | |
|---|---|---|---|---|---|---|---|---|---|---|
| Synperonic T304 (4) | = | = | = | = | = | = | = | = | = | = |
| Sodium Gluconate (5) | = | = | = | = | = | = | = | 10 | 10 | 10 |
| Caprylic Acid (6) | 20 | 25 | 30 | 15 | 20 | 25 | 32 | 10 | 13 | 25 |
| LiNO$_3$ (7) | 10 | 10 | 10 | 15 | 15 | 15 | 15 | 6.6 | 6.6 | 6.6 |

*: Crafol AP261 is commercially available as a 30 % wt solution and the values given in this table refer to the solution and not to the active ingredient.
(1) Na-metasilicate pentahydrate commercially available from SILMACO NV.;
(2) CRAFOL AP261 is an alkyl ether phosphate sodium salt; trademark of COGNIS;
(3) SURFYNOL 104H; trademark of Keyser & Mackay:

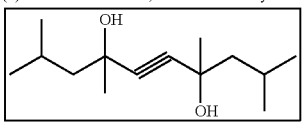

(4) SYNPERONIC T304 is a block copolymer of polyethyleneoxide (PEO) and polypropyleneoxide (PPO) attached to ethylenediamine (EDA) with ratio's of EDA/PPO/PEO 1/15/14 and a mean molecular weight of 1600 g/mol, trademark of ICI;
(5) Sodium gluconate:

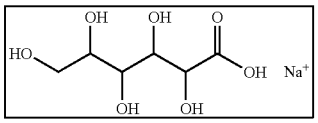 [SMILES: O=C(O)C(O)C(O)C(O)C(O)CO ; [Na+]]

(6) Caprylic acid (98%) commercially available from Akzo Nobel;
(7) LiNO$_3$ (98%) commercially available Chemosyntha N.V..

4. Sludge Evaluation.

1026 cm$^2$ of the exposed printing plate precursor PPP-1 (exposed on an AVALON LF trademark of Agfa Graphics: 196 mJ/cm$^2$@152 rpm) was cut into 24 strips of 4.5 cm×9.5 cm and these strips were consecutively processed by dipping them during 30 seconds in a small temperature-controlled tank containing 20 ml of a developing solution at 25° C. This tank was placed on a reciprocating shaker (GFL3015 trademark of Gesellschaft air Labortechnik GmbH). It was checked visually that the coating completely had been dissolved. The remaining developer on each strip after removal from the developing solution was squeezed off with a "FIL-MABSTREIFER 4070" trademark of Kaiser Fototechnik GmbH & Co. KG. After development of 1026 cm$^2$ of exposed PPP-1, about 18 ml of developing solution remains available. After keeping this developing solution for 3 days at room temperature, it was centrifugated (3500 rpm in a HERAEUS LABOFUGE 400 trademark of Heraeus). After drying 4 hours at 120° C. the residues were weighted and this results in the gravimetric determination of the sludge level.

5. Cloud Point Evaluation.

The cloud point temperature is defined as the temperature at which a liquid begins to become cloudy. Fresh or exhausted developers typically become cloudy when the temperature is increased. This behaviour may create some precipitate and/or deposit materials in the developer and/or can be the start of sludge formation, especially due to temperature increase in the neighborhood of heating elements in a processor. The cloud point of an exhausted developer must be above a critical temperature to prevent the formation of precipitate and/or deposit materials.

The cloud point of the supernatans from the previous evaluation was evaluated as follows:

A few millimetres of the exhausted developer (coming from the previous sludge evaluation test) were put in a NMR tube (length: 178 mm, outside diameter: 5 mm, wall thickness: 0.38 mm) and this tube was plunged halfway in a water bath at 25° C. Turbidity is visually assessed with a light while the temperature of the water is increased in steps of 5° C. from 25° C. to 90° C. The test is stopped when the solution becomes cloudy and/or if some precipitate appears.

6. Results.

In Table 6 the cloud point of the exhausted developers and the sludge level for each of the developer solutions DEV-1 to DEV-21 are given.

A cloud point of the (exhausted) developer of at least 80° C. is required in order to eliminate the risk of precipitate and/or deposit materials, and/or sludge formation. In addition, a cloud point of 80° C. provides a sufficient working latitude in day-to-day practice.

TABLE 6

Cloud point and sludge level results.

| Developer | Cloud Point* ° C. | Sludge level mg | Conc. of Li$^+$ g/l | Conc. of caprylate g/l |
|---|---|---|---|---|
| DEV-1 Comp. | 40 | nd** | 0 | 4.3 |
| DEV-2 Comp. | 60 | nd** | 0 | 13 |
| DEV-3 Comp. | 60-65 | 68.68 | 0 | 15 |
| DEV-4 Comp. | 70-75 | 77.32 | 0 | 20 |
| DEV-5 Comp. | 70-75 | 64.68 | 0 | 25 |
| DEV-6 Comp. | 75-80 | 73.63 | 0 | 30 |
| DEV-7 Comp. | 50-55 | 14.27 | 0.5 (0.072 M) | 15 (0.104 M) |
| DEV-8 Comp. | 70-75 | 10.70 | 0.5 (0.072 M) | 20 (0.139 M) |
| DEV-9 Comp. | 70-75 | 17.57 | 0.5 (0.072 M) | 25 (0.173 M) |
| DEV-10 Comp. | 70-75 | 23.32 | 0.5 (0.072 M) | 30 (0.208 M) |
| DEV-11 Comp. | 45-50 | 9.12 | 1.0 (0.144 M) | 15 (0.104 M) |
| DEV-12 Comp. | 70 | 11.27 | 1.0 (0.144 M) | 20 (0.139 M) |
| DEV-13 Inv. | 85-90 | 8.74 | 1.0 (0.144 M) | 25 (0.173 M) |
| DEV-14 Inv. | >90 | 13.23 | 1.0 (0.144 M) | 30 (0.208 M) |
| DEV-15 Comp. | 40-45 | 8.98 | 1.5 (0.216 M) | 15 (0.104 M) |
| DEV-16 Comp. | 55-60 | 6.96 | 1.5 (0.216 M) | 20 (0.139 M) |
| DEV-17 Comp. | 70-75 | 8.03 | 1.5 (0.216 M) | 25 (0.173 M) |
| DEV-18 Inv. | >90 | 8.18 | 1.5 (0.216 M) | 32 (0.222 M) |
| DEV-19 Comp. | 40-45 | nd** | 0.66 (0.095 M) | 10 (0.069 M) |

TABLE 6-continued

Cloud point and sludge level results.

| Developer | Cloud Point* °C. | Sludge level mg | Conc. of Li+ g/l | Conc. of caprylate g/l |
|---|---|---|---|---|
| DEV-20 Comp. | 50-55 | nd** | 0.66 (0.095 M) | 13 (0.090 M) |
| DEV-21 Inv. | >90 | nd** | 0.66 (0.095 M) | 25 (0.173 M) |

*cloud point of the exhausted developer;
**nd: not determined.

From Table 6 it can be concluded that:
the addition of lithium ions to the developer effectively limits the generation of sludge (see results obtained for DEV-1 to DEV-6 and DEV-7 to DEV-10);
the addition of lithium ions results in an unfavourable lowering of the cloud point of the exhausted developer (see results obtained for DEV-1 to DEV-6 and DEV-7 to DEV-10);
the addition of caprylic acid to the developer increases the cloud point (see results obtained for DEV-1 to DEV-6);
that surprisingly beyond 0.5 g/l (0.05% wt or 0.072 M) of lithium ions the cloud point of the exhausted developer is unexpectedly high when the ratio of the molar concentration of caprylic acid to the molar concentration of the lithium ions is equal to or higher than 1 (see results obtained for DEV-11, DEV-12, DEV-15 to DEV-17, DEV-19 and DEV-20—comparative results—versus DEV-13, DEV-14, DEV-18 and DEV-21-inventive results).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for making a positive-working lithographic printing plate, the method comprising the steps of:
providing a heat-sensitive printing plate precursor including on a support, having a hydrophilic surface or which is provided with a hydrophilic layer, a heat-sensitive coating;
image-wise exposing the precursor with heat and/or light; and
developing the exposed precursor with an aqueous alkaline, silicate based developing solution including lithium ions at a concentration of at least 0.05% wt and a salt of an aliphatic carboxylic acid; wherein
a molar ratio of the salt of the aliphatic carboxylic acid to the lithium ions is >1; and
the salt of the aliphatic carboxylic acid comprises 8 to 12 carbon atoms.

2. A method according to claim 1, wherein the concentration of the lithium ions is at least 0.1% wt.

3. A method according to claim 1, wherein the molar ratio of the salt of the aliphatic carboxylic acid to the lithium ions is greater than 1.

4. A method according to claim 2, wherein the molar ratio of the salt of the aliphatic carboxylic acid to the lithium ions is greater than 1.

5. A method according to claim 1, wherein the developing solution includes an image dissolution inhibiting agent.

6. A method according to claim 5, wherein the image dissolution inhibiting agent is selected from:

(a) polyglycols with the following structure:

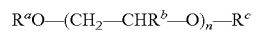

$$R^aO-(CH_2-CHR^b-O)_n-R^c$$

wherein
$R^a$ represents hydrogen, an optionally substituted alkyl group including 1 to 30 carbon atoms, $-COR^t$, or an optionally substituted aryl or aralkyl group;
$R^b$ represents hydrogen, methyl, ethyl, and/or mixtures thereof;
$R^c$ represents hydrogen, an alkyl group, $-COR^d$, $-NR^dR^e$, $-CH_2COOH$, or $-CH_2COO^-M^+$; and
$M^+$ represents $NH_4^+$, $Na^+$, or $K^+$ and $R^d$, $R^e$, and $R^t$ independently represent hydrogen, an optionally substituted alkyl group including 1 to 30 carbon atoms, an optionally substituted aryl group or aralkyl group;

(b) polycondensation products of one or more alkylene groups and/or one or more polyoxyalkylene groups with an alkylene diamine, an alkylene triamine, an alkylene polyamine, or an alkylene imine group;

(c) cationic surfactants including primary, secondary, tertiary, or quaternary ammonium salts, phosphonium salts, or sulfonium salts.

7. A method according to claim 1, wherein the heat-sensitive coating comprises at least two layers including:
a first layer including a water-insoluble and alkali soluble resin which exhibits an increased solubility upon exposure to heat and/or light; and
a second layer, which is located between the support and the first layer, including a water-insoluble and alkali soluble resin.

8. A method according to claim 7, wherein the second layer includes a sulphonamide binder.

9. A method according to claim 8, wherein the sulfonamide binder is represented by:

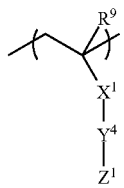

wherein
$R^9$ represents hydrogen or a hydrocarbon group including up to 12 carbon atoms;
$X^1$ represents a single bond or a divalent linking group;
$Y^4$ is a bivalent sulphonamide group; and
$Z^1$ represents a terminal group.

10. A method according to claim 2, wherein the heat-sensitive coating comprises at least two layers including:
a first layer including a water-insoluble and alkali soluble resin which exhibits an increased solubility upon exposure to heat and/or light; and
a second layer, which is located between the support and the first layer, including a water-insoluble and alkali soluble resin.

11. A method according to claim 10, wherein the developing solution includes an image dissolution inhibiting agent.

12. A method according to claim 4, wherein the heat-sensitive coating comprises at least two layers including:
a first layer including a water-insoluble and alkali soluble resin which exhibits an increased solubility upon exposure to heat and/or light; and a second layer, which is located between the support and the first layer, including a water-insoluble and alkali soluble resin.

13. A method according to claim 12, wherein the developing solution includes an image dissolution inhibiting agent.

14. A method according to claim 1, wherein the heat-sensitive coating comprises at least two layers including:
a first layer including a water-insoluble and alkali soluble resin which exhibits an increased solubility upon exposure to heat and/or light; and
a second layer, which is located between the support and the first layer, including a water-insoluble and alkali soluble resin.

15. A method according to claim 14, wherein the second layer includes a sulphonamide binder.

16. A method according to claim 15, wherein the sulfonamide binder is represented by:

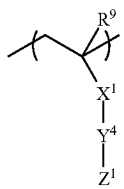

wherein
$R^9$ represents hydrogen or a hydrocarbon group including up to 2 carbon atoms;
$X^1$ represents a single bond or a divalent linking group;
$Y^4$ is a bivalent sulphonamide group; and
$Z^1$ represents a terminal group.

17. A method according to claim 14, wherein the developing solution includes an image dissolution inhibiting agent.

18. A method according to claim 17, wherein the image dissolution inhibiting agent is selected from:
(a) polyglycols with the following structure:

$$R^aO\text{---}(CH_2\text{---}CHR^b\text{---}O)_n\text{---}R^c$$

wherein
$R^a$ represents hydrogen, an optionally substituted alkyl group including 1 to 30 carbon atoms, —$COR^t$, or an optionally substituted aryl or aralkyl group;
$R^b$ represents hydrogen, methyl, ethyl, and/or mixtures thereof;
$R^c$ represents hydrogen, an alkyl group, —$COR^d$, —$NR^dR^e$, —$CH_2COOH$, or —$CH_2COO^-M^+$; and
wherein M+ represents $NH_4$+, Na+, or K+ and $R^d$, $R^e$, and $R^t$ independently represent hydrogen, an optionally substituted alkyl group including 1 to 30 carbon atoms, or an optionally substituted aryl group or aralkyl group;

(b) polycondensation products of one or more alkylene groups and/or one or more polyoxyalkylene groups with an alkylene diamine, an alkylene triamine, an alkylene polyamine, or an alkylene imine group;
(c) cationic surfactants including primary, secondary, tertiary, or quaternary ammonium salts, phosphonium salts, or sulfonium salts.

19. A method for making a positive-working lithographic printing plate, the method comprising the steps of:
providing a heat-sensitive printing plate precursor including on a support, having a hydrophilic surface or which is provided with a hydrophilic layer, a heat-sensitive coating;
image-wise exposing the precursor with heat and/or light; and
developing the exposed precursor with an aqueous alkaline, silicate based developing solution including lithium ions at a concentration of at least 0.05% wt and a salt of an aliphatic carboxylic acid; wherein
a molar ratio of the salt of the aliphatic carboxylic acid to the lithium ions is $\geq 1$;
the developing solution includes an image dissolution inhibiting agent;
the image dissolution inhibiting agent is selected from:
(a) polyglycols with the following structure:

$$R^aO\text{---}(CH_2\text{---}CHR^b\text{---}O)_n\text{---}R^c$$

wherein
$R^a$ represents hydrogen, an optionally substituted alkyl group including 1 to 30 carbon atoms, —$COR^t$, or an optionally substituted aryl or aralkyl group;
$R^b$ represents hydrogen, methyl, ethyl, and/or mixtures thereof;
$R^c$ represents hydrogen, an alkyl group, —$COR^d$, —$NR^dR^e$, —$CH_2COOH$, or —$CH_2COO^-M^+$; and
$M^+$ represents $NH_4^+$, Na+, or $K^+$ and $R^d$, $R^e$ and $R^t$ independently represent hydrogen, an optionally substituted alkyl group including 1 to 30 carbon atoms, an optionally substituted aryl group or aralkyl group;
(b) polycondensation products of one or more alkylene groups and/or one or more polyoxyalkylene groups with an alkylene diamine, an alkylene triamine, an alkylene polyamine, or an alkylene imine group;
(c) cationic surfactants including primary, secondary, tertiary, or quaternary ammonium salts, phosphonium salts, or sulfonium salts; and
the image dissolution inhibiting agent is the polycondensation product of the one or more alkylene groups and/or the one or more polyoxyalkylene groups with an alkylene diamine, an alkylene triamine, an alkylene polyamine, or an alkylene imine group.

* * * * *